United States Patent [19]
Hoffmann

[11] 3,887,881
[45] June 3, 1975

[54] LOW VOLTAGE CMOS AMPLIFIER

[75] Inventor: Kurt Hoffmann, Sunnyvale, Calif.

[73] Assignee: American Micro-Systems, Inc., Santa Clara, Calif.

[22] Filed: Jan. 24, 1974

[21] Appl. No.: 436,151

[52] U.S. Cl. .................. 330/35; 330/13; 331/116 R
[51] Int. Cl. .............................................. H03f 3/16
[58] Field of Search .................. 330/13, 18, 35, 38; 331/116 R

[56] References Cited

UNITED STATES PATENTS 3,664,118 5/1972 Walton .............................. 331/116
3,676,801 7/1972 Musa ................................ 331/116
3,757,510 9/1973 Dill .................................... 331/116

*Primary Examiner*—John Kominski
*Attorney, Agent, or Firm*—Owen, Wickersham & Erickson

[57] ABSTRACT

A low voltage CMOS amplifier, particularly adaptable for use with an oscillator in an electronic watch. The relatively large biasing resistor used in prior art CMOS amplifiers is eliminated and transistors are provided in a network to provide proper biasing and also enable the amplifier to operate at a lower power supply voltage than prior art amplifiers.

5 Claims, 6 Drawing Figures

LOW VOLTAGE CMOS AMPLIFIER

BACKGROUND OF THE INVENTION

This invention relates to an electronic amplifier particularly adapted for implementation in complementary conductor devices such as npn and pup transistors or CMOS devices.

Complementary MOS devices utilizing both P-channel and N-channel transistors have been used extensively in products such as watches because of their inherent low power characteristics. However, the conventional CMOS amplifier heretofore devised could only be DC-biased if its power supply voltage was larger than the sum of the threshold voltages of its two complementary transistors. In situations where the power supply voltage available was limited, this imposed a serious processing limitation. Also, the prior CMOS amplifier circuit required a relatively large biasing resistor in order to avoid unnecessary attenuations. When using a standard MOS process, it was almost impossible to implement such a high resistance with reasonable precision.

It is therefore one object of the present invention to provide an improved CMOS circuit that solves the aforesaid problems.

Another object of the present invention is to provide a CMOS amplifier which will operate satisfactorily when the power supply voltage is only enough to exceed the separate threshold voltage of each complementary transistor.

Another object of the present invention is to provide a CMOS amplifier that eliminates the need for a biasing resistor thereby making it possible to use conventional MOS process techniques that are economical and have high yield factors.

Yet another object of the present invention is to provide a CMOS amplifier that is particularly adaptable for use in electronic watches and that can be readily combined with conventional components such as capacitors and crystal vibrators to provide an oscillator circuit.

SUMMARY OF THE INVENTION

The aforesaid and other objects of the invention are accomplished by a CMOS amplifier circuit wherein the biasing of the two complementary amplifying transistors connected between the regular power source and ground, as required to provide amplification in the well known "push-pull" type arrangement, is accomplished by a separate network of biasing transistors for each amplifying transistor. Each such network is in effect a divider comprised of two transistors connected together between the power source and ground with the output of the divider being applied as the biasing voltage to the gate of the amplifying transistor. The need for the long feedback resistor used in prior art CMOS amplifying circuits is eliminated. More importantly, the voltage required to operate the amplifier need only be greater than the threshold voltage of each amplifying transistor instead of greater than the combined threshold voltages of both amplifying transistors, as in the prior art. The amplifying circuit may be readily combined with conventional oscillators such as the Pierce type and is particularly adaptable for use in small, low power consuming devices such as watches.

Other objects, advantages and features of the present invention will become apparent from the following detailed description which is presented in conjunction with the accompanying drawing.

DETAILED DESCRIPTION OF EMBODIMENTS

Figures 1, 2:
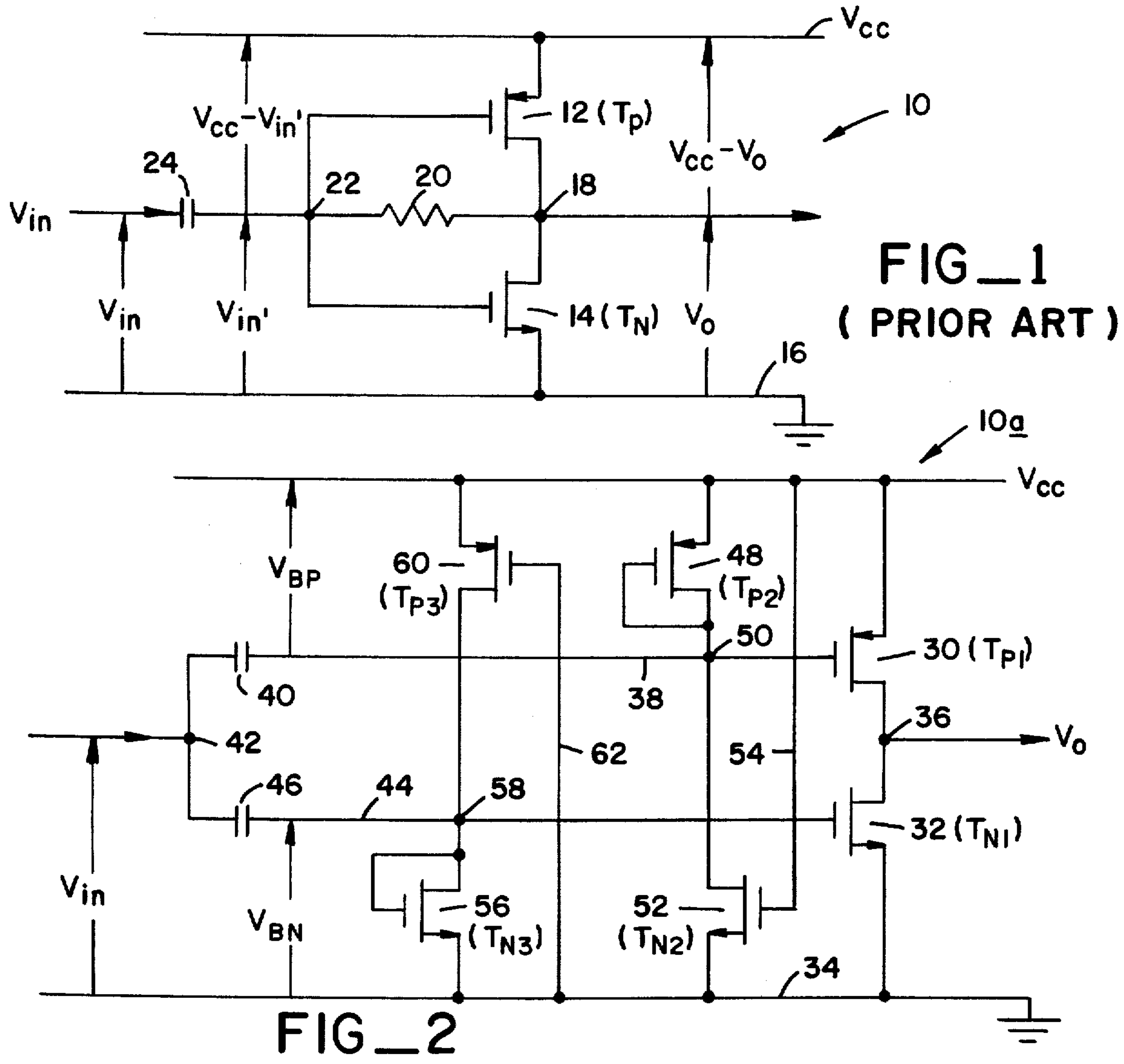
FIG 1 (PRIOR ART) FIG 2
FIG. 1 is a circuit diagram of a CMOS amplifier of the prior art.
FIG. 2 is a circuit diagram of a CMOS amplifier embodying the principles of the present invention.

With reference to the drawing, FIG. 1 shows a push-pull type amplifier circuit 10 of the prior art which is implemented as a complementary metal-oxide-silicon (MOS) circuit wherein a P-channel transistor 12 ($T_P$) is connected from a supply voltage line $V_{CC}$ to an N-channel transistor 14 ($T_N$) connected to a ground line 16. From a junction 18 between these transistors extends an output $V_o$. In order for such an amplifier to function properly, stable D.C. conditions must be established. Therefore, junction 18 is also connected through a biasing feedback resistor 20 to another junction 22 which is connected by separate leads to the gates of both transistors 12 and 14. The input V*in*to the amplifier is provided through a capacitor 24 to the junction 22. In this circuit, the D.C. biasing of the transistors is provided by the voltage division at junction 22 which is fed back from the junction 18 through the resistor 20 to both transistor gates. The capacitor 24 prevents any reverse D.C. flow, so the D.C. biasing provided is independent of the V*in* conditions. Now, when a sinusoidal or pulsing input voltage (V*in*) is applied, it passes through the relatively low impedance capacitor 24 and then, because of the relatively high impedance resistor 20 is applied on the gates of both transistors 12 and 14. This voltage change causes a large current flow through each transistor which amounts to a voltage increase or swing that is much larger than the input voltage V*in*.

With the aforesaid prior art amplifier 10, it will be shown, as follows, that, for normal operation the supply voltage V*cc* must be greater than the combined threshold voltages $V_{TP}$ and $V_{TN}$ of the two transistors.

In this derivation, both threshold voltages $V_{tn}$ and $V_{tp}$ are assumed to be positive and it may also be assumed that the conduction factors for the two transistors are the same, so that $K_N = K_p$.

Under DC conditions:

$$V_{in} = V_o \text{ and } (V_{CC} - V_O) = V_{CC} - V_{in}).$$

Because both devices are in saturation:

$I_N = K_N (V_o - V_{tn})^2$ and $I_p = k_p [V_{CC} - V_O) - V_{tp}]^2$ and $I_N = I_p$ The DC output voltage of the amplifier is:

$$(V_O - V_{Tn}) = (V_{CC} - V_O - V_{tp})\ V_O = ½ (V_{CC} - V_{tp} + V_{tn}) \quad (1)$$

The requirements for proper DC-bias of the amplifier are:

$$(V_O - V_{tn}) > 0 \tag{2}$$

and $$[(V_{CC} - V_O) - V_{tp}] > 0 \tag{3}$$

where $(V_O - V_{tn})$ is the overdrive of transistor $T_N$ and $[V_{CC} - V_O) - V_{tp}]$ of transistor $T_p$. Substituting equation 1 into equation 2, gives:

$$[\tfrac{1}{2}(V_{CC} - V_{tp} + V_{tn}) - V_{tn}] > 0$$

and thus:

$$V_{CC} > (V_{tn} + V_{tp}) \tag{4}$$

This means that the amplifier can only be DC-biased properly, if the power supply voltage $V_{CC}$ is larger than the sum of the threshold voltages.

Now, turning to FIG. 2, my improved amplifier 10$a$ is shown which embodies the principles of the present invention and requires less power. Here, two complementary P-channel and N-channel MOS transistors 30 ($T_{P1}$) and 32 (TN1) are similarly connected together between the power line $V_{CC}$ and a ground line 34, with a junction 36 between them providing the circuit output $V_O$. The gate of the P-channel transistor 30 is connected by a lead 38 through a capacitor 40 to a junction 42 and the gate of the N-channel transistor is connected by a lead 44 through a similar capacitor 46 to the same junction which is connected to the input to be amplified ($Vin$). Now, a first P-channel biasing transistor 48 ($T_{p2}$) is connected at its source to the $V_{CC}$. Its gate and drain are connected together and to a junction 50 in the lead 38 between the capacitor 40 and the gate of transistor 30. Junction 50 is also connected to the drain of another N-channel transistor 52 whose source is connected to the ground line 34. The gate of this latter transistor is connected by a lead 54 to $V_{CC}$.

A similar pair of biasing transistors are provided for the transistor 32. Thus, an N-channel transistor 56 is connected from its source to the ground line while its gate and drain are connected together and to a junction 58 in the lead 44 between the capacitor 46 and the gate of transistor 32. The junction 58 is also connected to the drain of a P-channel transistor 60 whose source is connected to $V_{CC}$ and whose gate is connected by a lead 62 to the ground line. Essentially, the transistors 48 and 52 and the transistors 60 and 56 are all high impedance devices which function as two separate divider networks that furnish the proper D.C. biasing for the transistors 30 and 32 respectively. To achieve proper biasing of transistor 32 for example, the transistors 60 and 56 are made of a size such that the transistor 60 functions basically as a current generator into the transistor 56 which provides a voltage drop at the junction 58 and thus at the gate of transistor 32. This drop is larger than the threshold voltage $V_{TN}$ of transistor 32. The biasing transistor 52 works with transistor 48 in a similar way, transistor 52 being essentially a current generator which creates a voltage drop across transistor 48, thereby biasing transistor 30.

The amplifier 10$a$ of FIG. 2 does not have the restrictions of the prior art amplifier of FIG. 1, particularly with respect to power requirements, as will be demonstrated in the following derivation:

(Note: $V_{tp}$ and $V_{tn}$ are the threshold voltages of the transistors 30 and 32 respectively and both are assumed to be positive).

The requirement for proper DC-biasing of transistor 32 is:

$$(V_{BN} - V_{tn}) > 0 \tag{5}$$

where $(V_{BN} - V_{tn})$ is the overdrive of transistor 32. The current through the biasing transistors $T_{N3}$ and $T_{p3}$ is respectively:

$I_{TN3} = k_{TN3}\,(V_{BN} - V_{tn})^2$ and $I_{TP3} = k_{TP3}\,(V_{CC} - V_{tp})^2$ with $$I_{TN3} = I_{TP3}$$

$$V_{BN} = \sqrt{\frac{K_{TP3}}{K_{TN3}}} \times (V_{CC} - V_{TP}) + V_{tn} \tag{6}$$

Substituting equation 6 into 5

$$\left[\left(\sqrt{\frac{k_{TP3}}{k_{TN3}}}(V_{CC} - V_{tp}) + V_{tn}\right) - V_{tn}\right]_{V_{CC} > V_{tp}} > 0 \tag{7}$$

which is the requirement for proper biasing of transistor $T_{N1}$. The requirement for biasing of transistor $T_{p1}$ is:

$$(V_{BP} - V_{tp}) > 0 \tag{8}$$

where $(V_{BP} - V_{tp})$ is the overdrive of transitor $T_{p1}$. The current through $T_{N2}$ and $T_{p2}$ is respectively:

$I_{TN2} = k_{TN2}\,(V_{CC} - V_{tn})^2$ and $I_{TP2} = k_{TP2}\,(V_{BP} - V_{tp})^2$ with $$I_{TN2} = I_{TP2}$$

$$V_{BP} = \sqrt{\frac{k_{TN2}}{k_{TP2}}} \times (V_{CC} - V_{tn}) + V_{tp} \tag{9}$$

substituting equation 9 into 8:

$$\left[\left(\sqrt{\frac{k_{TN2}}{k_{TP2}}}(V_{CC} - V_{tn}) + V_{tp}\right) - V_{tp}\right]_{V_{CC} > V_{tn}} > 0 \tag{10}$$

which is the requirement for proper biasing of transistor $T_{p1}$.

Comparing the results from amplifier FIG. 1 $V_{CC} > V_{tn} + V_{tp}$ 4 with the results from amplifier, FIG. 2

$$V_{CC} > V_{tp} \tag{7}$$

$$V_{CC} > V_{tn}$$

It is apparent that the voltage requirement for my amplifier circuit has been considerably reduced.

The operation of the entire circuit may be described as follows: With a constant voltage supplied between $V_{CC}$ and ground, assume that an input (V*in*) of some predetermined frequency is applied to the input junction 42. Since the resistivity of the capacitors 40 and 46 is low, essentially the same input appears in leads 38 and 44. Also, it may be assumed that the resistivity of all the biasing transistors 48, 60, 52 and 56 is so high that they do not appreciably attenuate the input signal V*in*. Now, as previously described, both of the transistors 30 and 32 are being properly biased at this time through their respective biasing transistors. Therefore, with the V*in* signal and the biasing voltage applied to the gates of 30 and 32, output ($V_o$) of the circuit at the junction 36 is amplified in accordance with a built-in gain factor that is dependent on the relative characteristics of the various biasing transistors.

Figure 3:
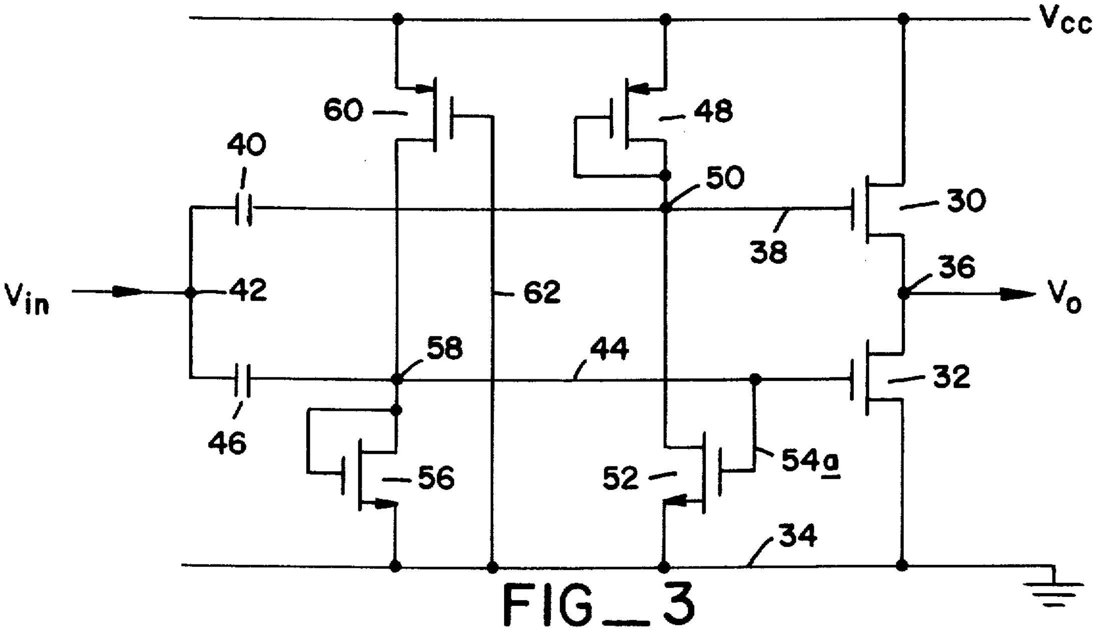
FIG. 3 is a circuit diagram showing a modified form of the amplifier of FIG. 2.

Since it is desirable that the amplifier have a high input impedance, the transistors 30 and 32 for the amplifier 10*a* of FIG. 2 must be relatively long. As shown in the embodiment of FIG. 3, this disadvantage can be avoided by connecting the gate of transistor 52 to lead 44 by a lead 54*a*. Because this transistor 52 receiving only the bias voltage instead of $V_{CC}$ on its gate, it has less overdrive than it has in the circuit of FIG. 2. Thus, the actual length of this element can be reduced substantially. If desired, the same result can be accomplished by connecting the gate of transistor 60 to lead 38.

Figure 4:
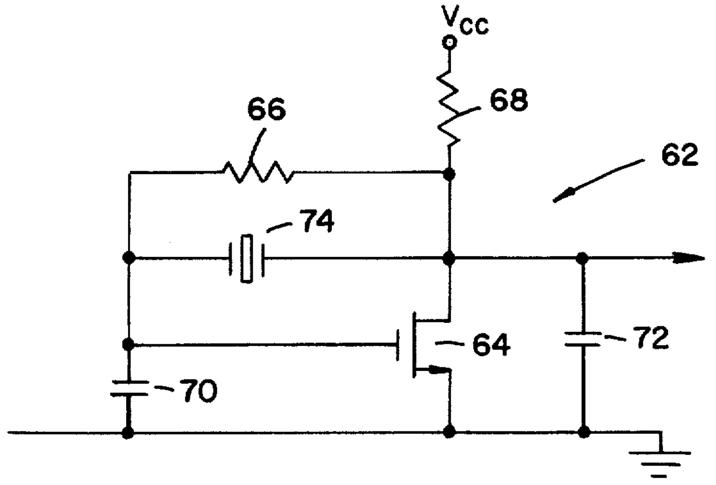
FIG. 4 is a diagram showing a standard form of crystal oscillator.
Figure 5:
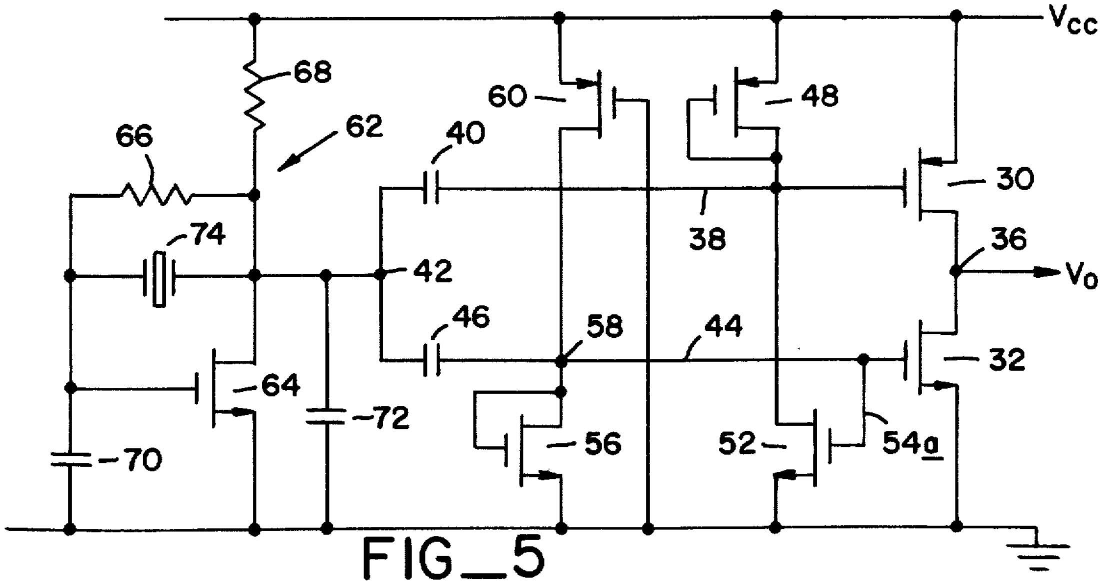
FIG. 5 is a circuit diagram showing the oscillator of FIG. 4 combined with an amplifier according to the present invention.

As stated previously, the amplifier circuit 10*a* embodying the principles of my invention is readily adaptable for use with an oscillator as a low power component of an electrical watch. A typical oscillator 62, known as a Pierce oscillator, is shown diagrammatically in FIG. 4. This oscillator can be readily implemented in monolithic form with an MOS transistor 64 as an active element, two external resistors 66 and 68, two capacitors 70 and 72 and a piezoelectric crystal vibrator 74. The circuit is connected between a suitable power source $V_{CC}$ and ground to excite the crystal electrically and produce an oscillating output. Because this oscillator and my low voltage CMOS amplifier are both well suited for very low voltage application, they may be readily combined as building blocks for a monolithic wrist watch, as shown in FIG. 5. Here, the oscillator output is connected directly to the input junction 42 and the oscillator 62 is operated by the same power source $V_{CC}$. The capacitors 40 and 46 and 72 are designed in such a way that capacitor 72 is the parasitic pn-junction capacitance of capacitors 40 and 46.

Figure 6:
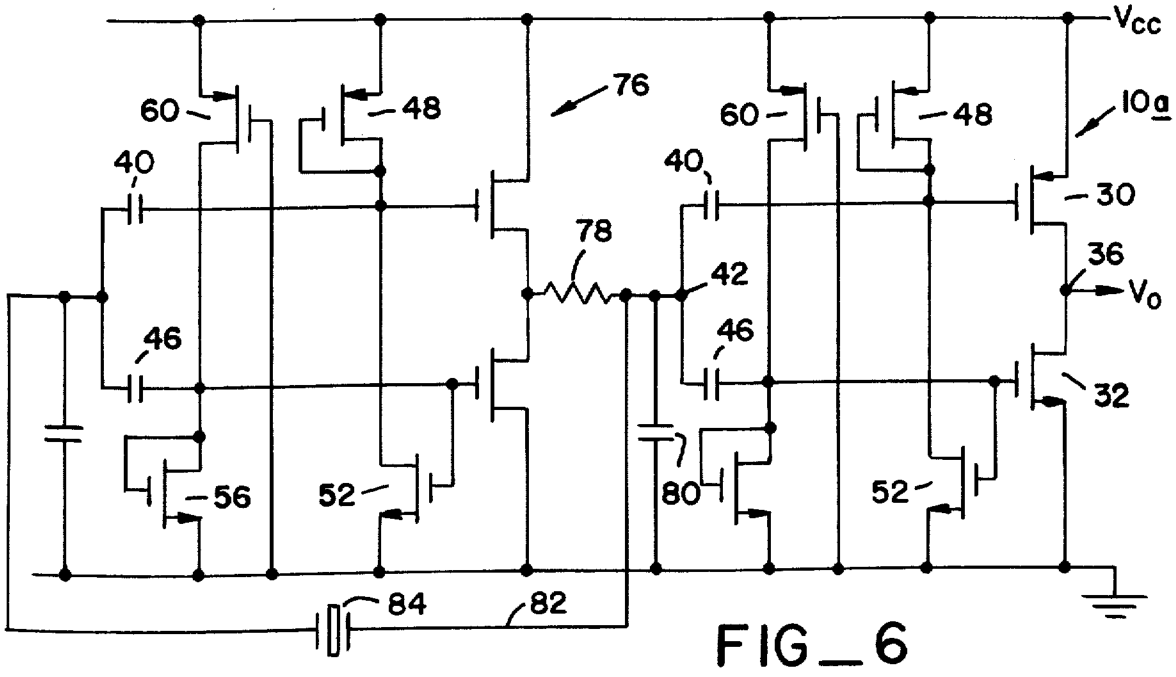
FIG. 6 is a circuit diagram showing another oscillator-amplifier circuit embodying the principles of the present invention.

In another alternative oscillator-amplifier arrangement according to the present invention, blocks shown in FIG. 5 using the Pierce type oscillator amplifier may be replaced with another low voltage CMOS amplifier block 76 which serves as an oscillator, as shown in FIG. 6. This arrangement eliminates the need for both of the external resistors $R_L$ and $R_F$ of the Pierce oscillator which are difficult to implement efficiently on an MOS device.

In order to achieve a high degree of frequency stability in this arrangement, a lag network comprised of a resistor 78 and a capacitor 80 may be used. The resistor 78 is connected between the output of the oscillating block 76 and the input to the amplifier block 10*a* and is also connected by a feedback lead 82 through a crystal oscillator 84 to the input of the oscillator block. The capacitor 80 is connected between the resistor 78 and the input junction to the amplifier and ground. Since the resistivity of 78 is of the order of kilo ohms, it can be easily integrated in monolithic form together with the other components. The crystal oscillator 84 provides an oscillating feedback signal to maintain the desired operating frequency of the circuit.

From the foregoing it should be apparent that the present invention not only solves the biasing problem for a CMOS amplifier but also provides an amplifier which is operable under extremely low power requirements. This feature, coupled with its inherent simplicity of implementation and functional versatility makes it uniquely applicable to microelectronic devices such as timing devices or watches.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. An amplifier comprising:

a pair of amplifying transistors connected to a common output junction, including a first transistor connected to a voltage supply line and a second transistor connected to a ground-line;

a first lead extending from an input junction to the gate of said first amplifying transistor and a second lead extending from said input junction to the gate of said second amplifying transistor, each of said leads being connected through a capacitor means for preventing the flow of direct current; and a pair of divider networks connected to said voltage supply line and said ground-line, each said network comprising a pair of biasing transistors connected in series and with a junction between them connected to at least one of said leads for the gates of said amplifying transistors.

2. The amplifier as described in claim 1 wherein one said network comprises a first biasing transistor connected between said supply line and said first lead and a second biasing transistor connected between said first lead and said ground line whose gate is connected to said supply line.

3. The amplifier as described in claim 1 wherein one said network comprises a first biasing transistor connected between said supply line and said second lead and a second biasing transistor connected between said second lead and said ground line whose gate is connected to said second lead.

4. The amplifier as described in claim 1 wherein said first amplifying transistor is formed as a P-Channel element of an integrated circuit semi-conductor device and said second amplifying transistor is an N-Channel element of the same device.

5. The amplifier as described in claim 4 wherein one transistor of each said divider network is a P-Channel element of said integrated circuit device and the other transistor of each said divider network is an N-Channel element.

* * * * *